United States Patent
Sjoedin

(10) Patent No.: US 7,665,201 B2
(45) Date of Patent: Feb. 23, 2010

(54) METHOD FOR MANUFACTURING ELECTRONIC MODULES

(75) Inventor: Hakan Sjoedin, Knivsta (SE)

(73) Assignee: Infineon Technologies AG, Munich (DE)

(*) Notice: Subject to any disclaimer, the term of this patent is extended or adjusted under 35 U.S.C. 154(b) by 312 days.

(21) Appl. No.: 11/532,223

(22) Filed: Sep. 15, 2006

(65) Prior Publication Data

US 2007/0062637 A1 Mar. 22, 2007

(30) Foreign Application Priority Data

Sep. 15, 2005 (EP) ................... 05020117

(51) Int. Cl.
*B23P 17/04* (2006.01)
(52) U.S. Cl. .......................... 29/592.1; 29/846; 29/847; 257/620; 438/113
(58) Field of Classification Search .................. 29/832, 29/835, 846–847, 583, 578, 413–414; 156/256, 156/277; 257/730, 659, 660, 690–692; 438/460, 438/462, 667
See application file for complete search history.

(56) References Cited

U.S. PATENT DOCUMENTS

| | | | | | |
|---|---|---|---|---|---|
| 4,217,689 | A | * | 8/1980 | Fujii et al. | 438/465 |
| 4,355,457 | A | * | 10/1982 | Barlett et al. | 438/460 |
| 4,965,408 | A | * | 10/1990 | Chapman et al. | 174/363 |
| 5,606,198 | A | * | 2/1997 | Ono et al. | 257/666 |
| 5,998,238 | A | * | 12/1999 | Kosaki | 438/114 |
| 6,300,224 | B1 | * | 10/2001 | Arima et al. | 438/462 |
| 6,414,374 | B2 | * | 7/2002 | Farnworth et al. | 257/620 |
| 6,894,386 | B2 | * | 5/2005 | Poo et al. | 257/730 |
| 7,037,759 | B2 | * | 5/2006 | Tao | 438/113 |
| 7,187,060 | B2 | * | 3/2007 | Usui | 257/659 |
| 2004/0125568 | A1 | | 7/2004 | Tao | 361/707 |
| 2004/0178500 | A1 | | 9/2004 | Usui | 257/734 |
| 2004/0219766 | A1 | | 11/2004 | Headley et al. | 438/460 |

FOREIGN PATENT DOCUMENTS

JP  2005109306  4/2005
WO  2004/032186  4/2004

* cited by examiner

*Primary Examiner*—Minh Trinh
(74) *Attorney, Agent, or Firm*—Coats & Bennett, P.L.L.C.

(57) ABSTRACT

A method for manufacturing electronic modules from a moulded module strip having a laminate including at least one conductive layer, and one or more dies and or surface mounted devices arranged on an upper surface of the laminate and embedded by a moulding compound, includes the steps of: cutting partway through the laminate reaching at least through the uppermost of the at least one conductive layers and thereby creating a cut of width in the laminate; applying a conductive coating covering the upper surface of the laminate, and further covering all surfaces of the cut, the conductive coating contacting the uppermost conductive layer in the laminate; singulating the moulded module strip into separate electronic modules by cutting all the way through the laminate by creating a second cut in said first cut, the second cut having a width d smaller than the width of the first cut.

7 Claims, 3 Drawing Sheets

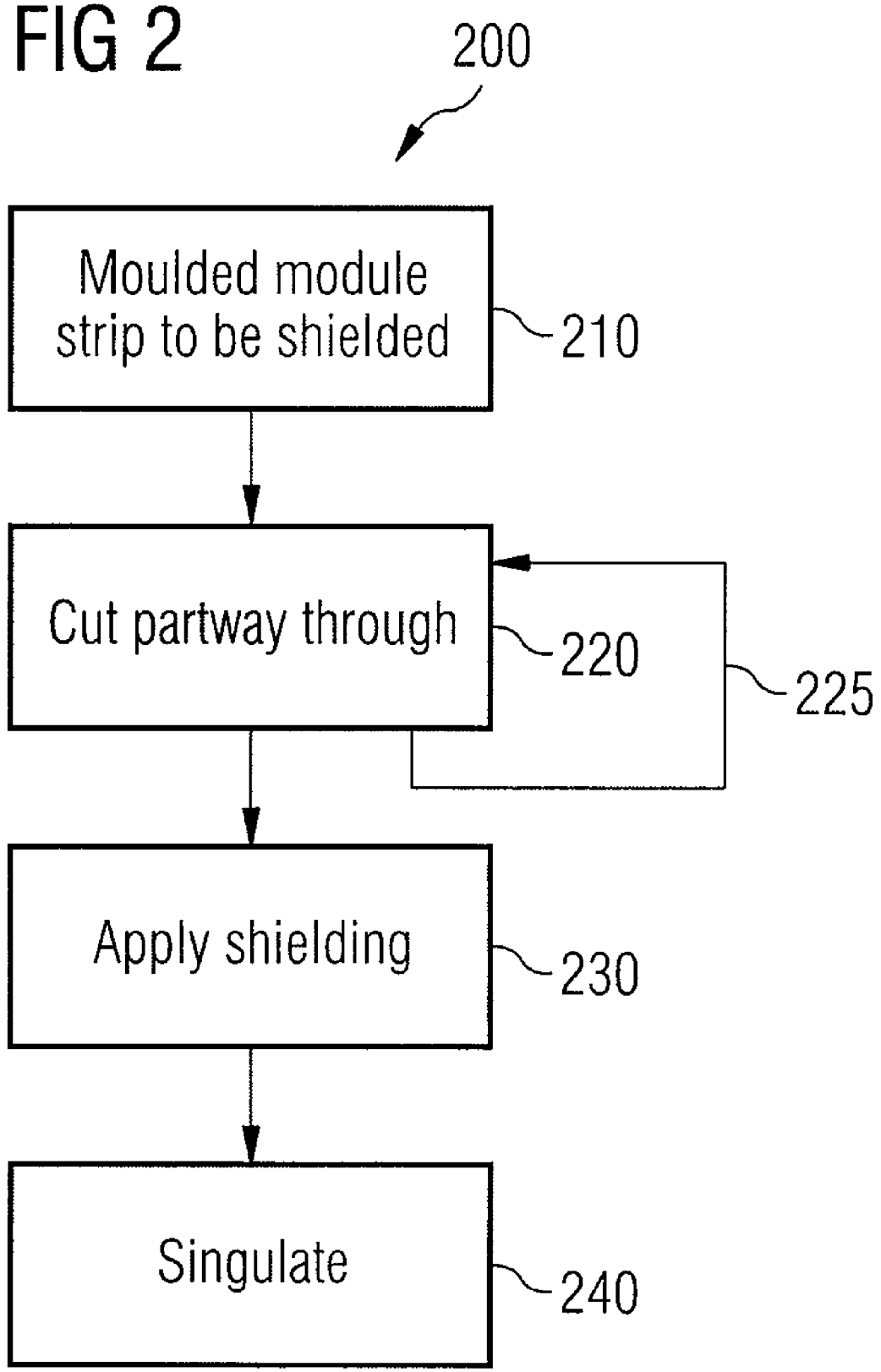

METHOD FOR MANUFACTURING ELECTRONIC MODULES

PRIORITY

This application claims priority from European Patent Application No. 05020117.7, which was filed on Sep. 15, 2005, and is incorporated herein by reference in its entirety.

TECHNICAL FIELD

The present invention generally relates to the field of electronic component technology, and more particularly to a method for manufacturing electronic modules from a laminate. The invention also relates to an electronic module.

BACKGROUND

The development of electronic products, such as cellular phones, computers and cameras, is towards smaller and smaller devices. The physical size of the devices should lessen as should their cost, which put high demands on, among other things, the layouts of integrated circuits required in the products, and the fabrication methods used for producing them.

The shielding of integrated circuit packages against electromagnetic interference (EMI) effects should also be made in as cost effective way as possible, while not compromising the quality requirements. Shielding is utilised for several reasons, a first reason being the fulfillment of government regulatory specifications, e.g. ETSI (European Telecommunications Standards Institute) specifications that for example put limits to allowed harmonics. Another reason for utilizing shielding is to provide immunity from other interfering wireless sources nearby, and yet another reason is to assure proper operation of a wireless transceiver itself by preventing transmission of non-intended radiation, such as from internal circuitry. Shortly, shielding is utilized in order to eliminate or at least minimize the effects of electromagnetic radiation.

There is a number of different ways to achieve shielding of an integrated circuit or electronic module. A commonly used solution is to mount a metallic hood to the module, for example by soldering. This however entails several drawbacks. A major drawback is the inflexibility of the fabrication process in that new tooling has to be provided in the production line for each change made to the module design. Another drawback is that the building height, i.e. the vertical height of the module increases, which of course is quite contrary to the wish of providing miniaturised modules and components. Further, the shielding efficiency is lessened due to holes in the metal, holes through which a moulding compound protecting the die is to be passed, or holes used for improving the inspectability of the module. Still further, the metallic hood constitutes an additional component to be manufactured and subsequently mounted on the module. Further yet, the mounting of the metallic hood also requires an extra space around the circuitry, for example in order to accomplish the soldering of the hood, again in contrary to the general goal towards smaller devices.

Another way to accomplish shielding of a module is to flip the package upside down and use the upper PCB copper plane as the shielding. However, this entails a more complex PCB (printed circuit board) and also an extra space requirement for accommodating solder balls of a ball grid array (BGA), if such surface-mount packaging is used. Further, this solution shows a very poor heat transfer performance and the heat dissipation for cooling the die is thus a major shortcoming.

Yet another way that has been contemplated for providing a shielding to a module is to integrate the shielding in the moulding compound, the moulding compound having a special composition containing absorbing/conductive fillers for absorbing and conducting the radiation, respectively. Further, the electrical performance of the device may also be affected by introducing such fillers. This solution would therefore probably be a very expensive solution involving substantial research and development costs.

SUMMARY

All the above-mentioned methods thus show several shortcomings, and it would therefore be desirable to be able to provide an electromagnetic shielding of integrated circuits or electronic modules in a more efficient and improved way.

A flexible and cost-efficient method for accomplishing electromagnetic shielding of electronic components can be provided. Furthermore, an electromagnetic shielding not requiring additional mounting space or additional mounting steps, nor adding any substantial building height to the component can be provided. In one embodiment, a method for manufacturing electronic modules from a moulded module strip including a laminate, and one or more dies and/or surface mounted devices arranged on an upper surface of the laminate embedded by a moulding compound, the laminate including a conductive layer, comprises the steps of (a) cutting partway through the laminate, reaching at least through said conductive layer, thereby creating a cut of a width in said laminate, (b) covering the upper surface of said laminate by conductive material, (c) covering at least one of the surfaces of said cut, by a conductive material, thereby establishing electrical contact between the conductive material on the upper surface of said laminate and said conductive layer in said laminate, and (d) singulating said moulded module strip into separate electronic modules by cutting all the way through said laminate by creating a second cut in said first cut, said second cut having a width smaller than the width of said first cut.

BRIEF DESCRIPTION OF THE DRAWINGS

These and other objects and features of the present invention will become clear from the following description taken in conjunction with the accompanying drawing, in which:

FIG. 2 is a flow chart summarizing the method for fabricating electronic modules in accordance with an embodiment of the present invention.

DETAILED DESCRIPTION

Figure 1A:
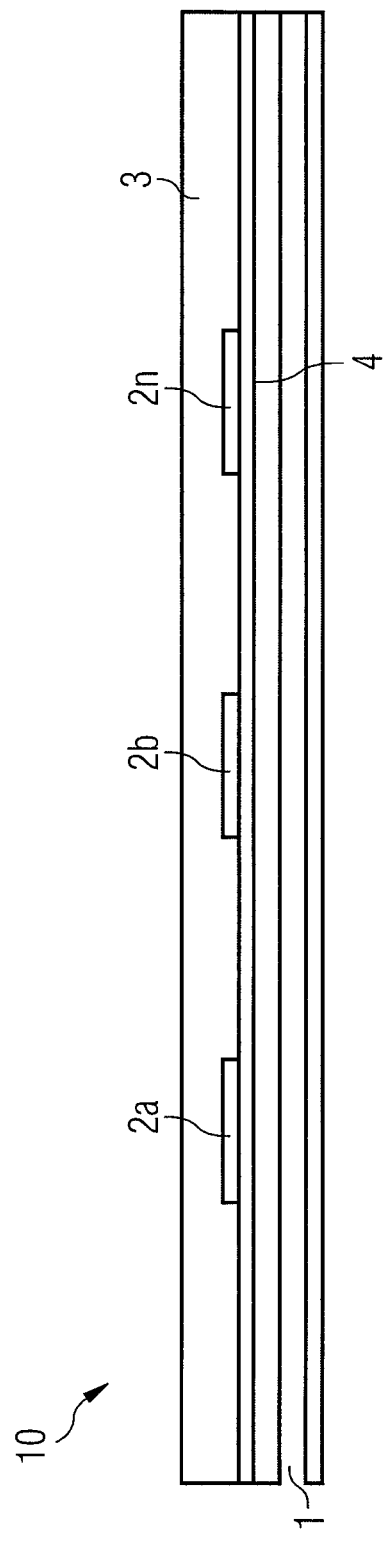
FIGS. 1a-1d illustrate schematically the steps of the method for fabricating shielded electronic modules in accordance with an embodiment of the present invention.

In another embodiment, an electronic module manufactured in accordance with the method for manufacturing electronic modules from a moulded module strip including a laminate, and one or more dies and/or surface mounted devices arranged on an upper surface of said laminate embedded by a moulding compound, said laminate including a conductive layer, the method including the steps of: (a) cutting partway through the laminate, reaching at least through said conductive layer, thereby creating a cut of a width in said laminate, (b) covering the upper surface of said laminate by conductive material, (c) covering at least one of the surfaces of said cut, by a conductive material, thereby establishing electrical contact between the conductive material on the upper surface of said laminate and said conductive layer in said laminate, and (d) singulating said moulded module strip into separate electronic modules by cutting all the way through said laminate by creating a second cut in said first cut, said second cut having a width smaller than the width of said first cut.

In another embodiment, an electronic module including a laminate, and one or more dies and/or surface mounted devices arranged on an upper surface of said laminate, and embedded by a moulding compound, comprises a conductive layer within said laminate, including a conductive coating covering the moulding compound, the upper surface of said laminate, and at least one side surface of said laminate to thereby establish an electric contact between said conductive coating and said conductive layer.

In another embodiment, a method for manufacturing electronic modules from a moulded module strip comprising a laminate including a conductive layer, and one or more dies and/or surface mounted devices arranged on an upper surface of the laminate, comprises that the one or more dies and/or surface mounted devices are embedded by a moulding compound. The method comprises the steps of cutting partway through the laminate, reaching at least through the conductive layer. Thereby a cut of a width D is created in the laminate. Thereafter a conductive coating is applied that covers the upper surface of the laminate, and further covers all surfaces of the previously made cut. The conductive coating is thereby in contact with the conductive layer in the laminate. Finally, a singulation of the moulded module strip into separate electronic modules is performed by cutting all the way through the laminate. This is done by creating a second cut in the first cut, wherein the second cut has a width smaller than the width of the first cut. By dividing the singulation process into two steps, with an intermediate step in which a shielding is provided, the invention brings about a great flexibility in the production of electronic products, not requiring a tooling change should the product layout change. This gives an improved and more cost-efficient fabrication process. Further yet, by the method, the building height of the electronic module is minimized, making the electronic device further yet smaller.

In accordance with one embodiment, step (b) of applying of a conducting layer is accomplished by means of sputtering, evaporation, spraying, electroplating, electroless plating or any combination thereof. This again provides flexibility in the fabrication of the final products, in which a deposition method suitable for a certain application may be chosen.

In accordance with yet another embodiment, the cutting is accomplished by means of sawing or milling. Any suitable cutting method may be used, yet again adding to the flexibility of the fabrication method.

In accordance with still another embodiment, the laminate is a printed circuit board (PCB) or a low-temperature co-fired ceramic (LTCC), whereby the invention may be utilized in a number of different applications.

In accordance with yet another embodiment, the conductive coating is a metal foil, such as copper foil, glued to the upper surface of the laminate. An indentation can be made above each of the modules, and it is thereby possible to improve the heat dissipation of the module.

The present application is also related to an electronic module, whereby advantages similar to the above described are achieved.

Further characteristics and advantages will be evident from the following detailed description of embodiments and the accompanying FIGS. 1a-d and 2, which are given by way of illustration only and are not to be construed as limitative of the invention.

With reference first to FIGS. 1a-1d, the method for manufacturing electronic modules from a moulded module strip is described. In particular, an innovative way for furnishing an electronic component or module with a shielding is described.

FIG. 1a shows a laminate 1, such as a printed circuit board (PCB) or low-temperature co-fired ceramics (LTCC) or the like, comprising several layers. The laminate 1 has several wire bonded chips or dies $2a, 2b, \ldots, 2n$ arranged on its upper surface and is further covered with a moulding compound 3 for protecting the dies $2a, 2b, \ldots, 2n$ and bonding wires (not shown) in a conventional manner. In the following description, wire bonded dies are used as an illustrative example of the invention, but the invention may equally well be used for single chips, stacked dies, flip-chips, and other surface mounted devices (SMD) such as resistors, inductors, capacitors or the like arranged on a laminate 1. One or more conductive layers 4 are also included in the laminate 1, for example metal layers such as Cu layers, providing e.g. ground planes and power planes known per se. In the present description, the laminate 1 including the dies $2a, 2b, \ldots, 2n$, the wire bonding, the one or more conductive layers 4 and the moulding compound 3 is referred to as a moulded module strip 10, and conventional methods for achieving it may be used. That is, ordinary assembly techniques may be used: flip-chip, wire bonding and/or surface mount technologies such as ball grid array (BGA) or land grid array (LGA).

In the production of electronic components, such as integrated circuits, the dies are usually arranged side by side vertically as well as horizontally in a checker pattern on the laminate. Thereby the singulation process, for example sawing, is performed in two directions: sawing first in one direction whereby a laminate thus comprising several modules is divided into strips comprising fewer modules. The strips are then singulated into single electronic modules, such as integrated circuits, by sawing in the direction perpendicular to the first sawing direction. The present invention, although not shown in the figures, may likewise be performed equally well in one or more directions.

Figure 1B:
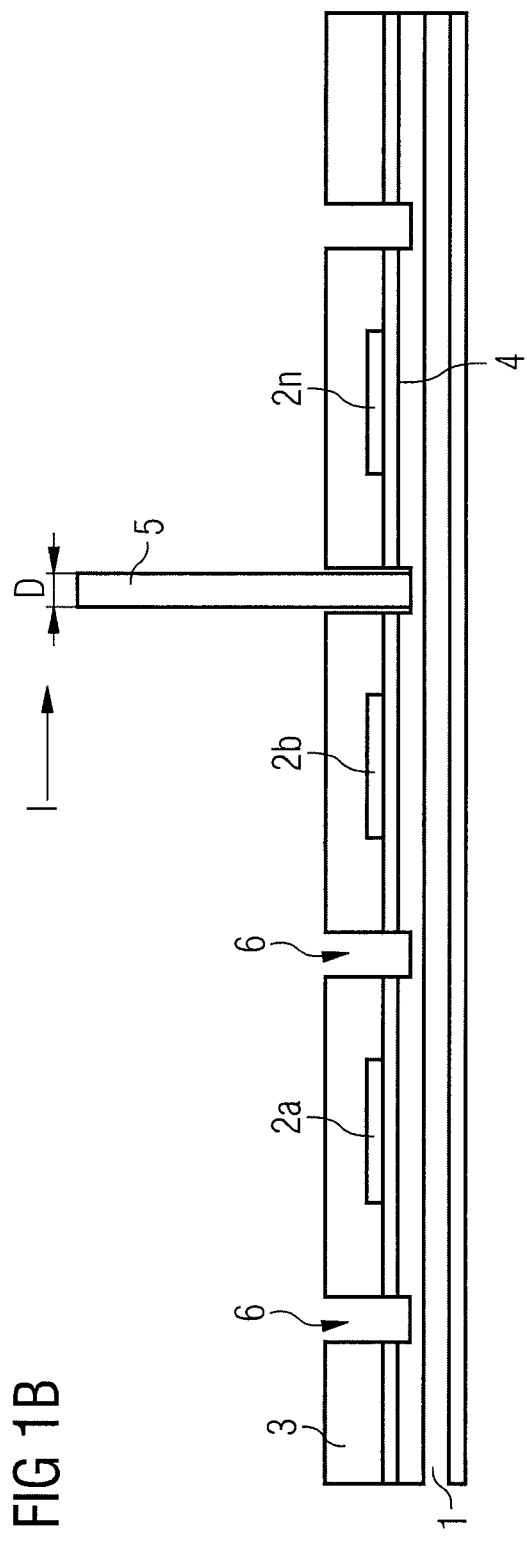

In FIG. 1b a sawing step is illustrated. Unlike prior art, in which the sawing is performed after the shielding has been mounted to each individual chip, or package, and in which the sawing is effectuated all the way through the laminate in a single step, the present invention uses a first saw blade 5 of a certain thickness D for sawing partway through the laminate 1. That is, sawing through the moulding compound 3 and into the laminate 1 and through the uppermost conductive layer 4. This is repeated along the length of the moulded module strip 10, as is indicated by the arrow I, accomplishing cuts 6 partway through the laminate 1 and, importantly, through the uppermost conductive layer 4 or the laminate 1.

Figure 1C:
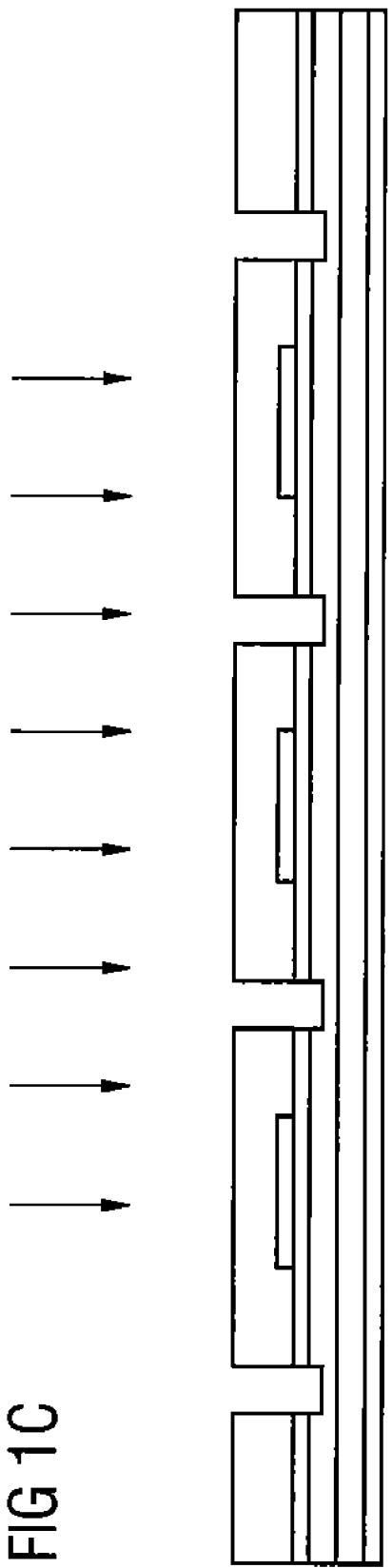

After completing the first sawing step a conductive material or conductive coating 7 is applied, or deposited, as is indicated by the arrows in FIG. 1c. In accordance with an embodiment an EM-shielding is provided by means of this metallization of the upper surface of the moulded module strip 10, that is, by applying a conductive coating 7 to the moulded module strip 10. This may be done in a number of ways, for example by means of sputtering, evaporation, spraying, electroplating, electroless plating or a combination of these techniques. Any suitable chemical or electrochemical deposition of metal can be used, giving a flexibility in the fabrication and easily changeable. The conductive coating 7 should cover the upper surface of the moulded module strip 10 and preferably all the surfaces of the one or more cuts 6 made in the first sawing step described above. However, it may be sufficient to cover only one side of the cut 6, a side that constitutes a lateral surface of the laminate, by a conductive material. Since the sawing was performed all the way through the upper conductive layer 4, the conductive coating 7 or metal shield just applied will now be in contact with the uppermost conductive layer 4. The product will thus have a conducting coating 7 in contact with the uppermost conductive layer 4 in the laminate and can be connected to ground or other stable voltage, thereby providing an efficient shielding from electromagnetic radiation.

In an alternative embodiment the electrical connection between the conducting coating 7 and the uppermost conductive layer 4 may be improved and/or ensured by filling the cut 6 with conductive filler 12. For example, when utilising a deposition method such as vaporization, it is often rather difficult to achieve a satisfying degree of coating in the cut 6. In such situation the described, additional step of filling the cut 6 with conductive filler 12 would be advantageous.

Figure 1D:
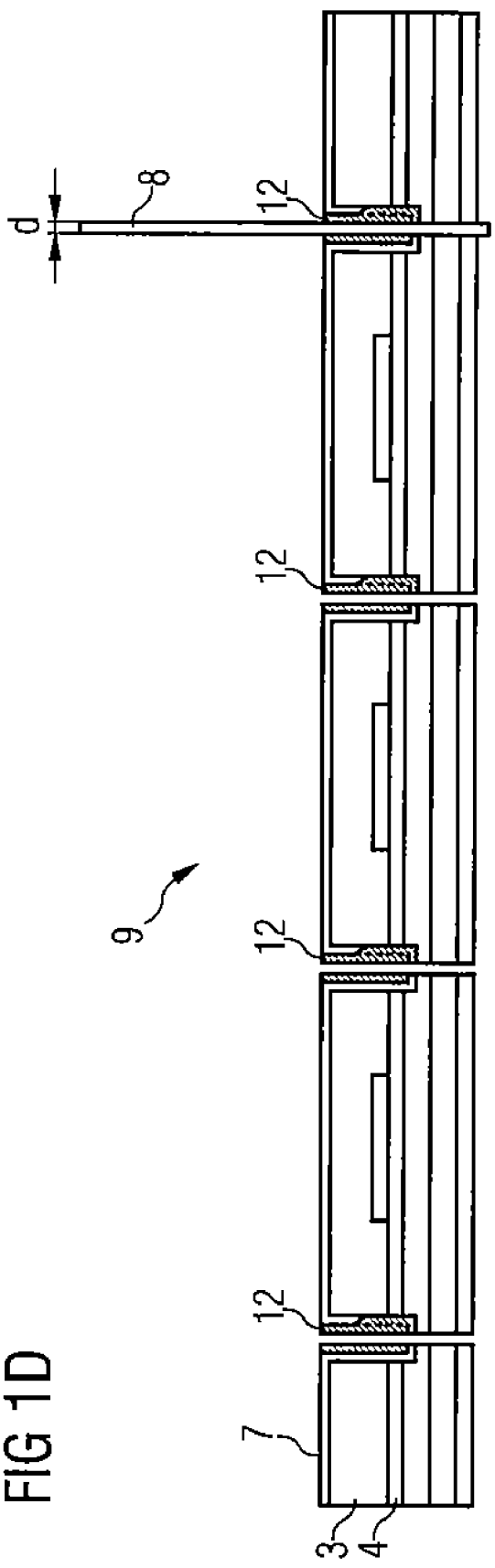

The last step of the method is a singulation step, shown in FIG. 1d. A sawing blade 8 having a width d smaller than the width D of the first sawing blade 5 should be used in order not to damage the conductive coating 7 applied in the previous step. The width D could for example be twice as large as the width d, or a ratio of 3 to 2, the key issue being that the conductive coating 7 should not be damaged in any way in the second sawing step. In this context, it is pointed out that the second cut preferably is as centred as possible in the first cut, again in order to not damage the conductive coating, although slightly non-centred second cuts are possible. A number of final products 9 is thus supplied each being provided with an excellent shielding.

The method has several advantages compared to prior art. The method is very flexible and can easily be adapted to new designs and different products. There is no longer any need for new tooling for such changes, the only changes are in the setting up of the cutting step, e.g. the sawing settings. The present method is thereby suitable for producing a variety of products, ranging from single chips to highly complex System-in-packages such as radio frequency (RF) packages for mobile phones (the RF-packages including transceivers, power amplifiers etc.), in short any product to which shielding from electromagnetic radiation need to be incorporated. The invention makes it possible to shield a conventional ball grid array (BGA) or land grid array (LGA) package solution having a smaller building height compared to prior art, and also requiring no extra area for mounting of the shield and having a reasonable manufacturing cost.

Further, the shielding of the present invention is connected to the laminate or substrate, not requiring the use of an adhesive material such as epoxy for attaching the shield as in prior art.

In the embodiment described above sawing is used as an illustrative example, but it is realised that any other cutting method can be utilised in alternative embodiments. For example, if the cutting method used is milling, a milling tool having a first thickness is utilised in the first cutting step, and a milling tool having a second thickness is utilised in the singulation step.

The steps of the manufacturing method are summarized in the flow chart 200 of FIG. 2. The method starts in step 210 by arranging a moulded module strip 10, comprising electronic modules to be electromagnetically shielded, in a flow line. Thereafter, in step 220, a partial cut-through is accomplished, and repeated (step 225) as many times as needed. This step is followed, in step 230, by depositing a conductive coating on the surface of the moulded module strip and the surfaces of the cuts. Finally, step 240, the moulded module strip 10 is singulated by continuing the cutting procedure in the previous cuts using a thinner cutting tool.

Heat generated by circuitry within electronic modules must be dissipated to improve the reliability of the electronic modules. Techniques for heat dissipation include the use of heat sinks, the use of thermal vias and the use of metal heat spreaders. Making the shielding thinner affects the heat conduction, but as most of the heat dissipation occurs downwards from the dies including the circuitry and not upwards, the thermal conduction aspect is thus of limited importance. However, there are applications in which this aspect is more pertinent, and in accordance with another embodiment taking the thermal issues into consideration and improving them, a conducting foil is used. A metal foil, such as for example a copper foil, is glued to a moulded module strip 10, after which the partial cutting through is performed. The flow chart shown in FIG. 2 is thus not applicable to this embodiment. The steps of the method is thus: providing a metal foil over the laminate 1, sawing partway through the laminate 1, filling the cut with a conductive material, and finally singulating the laminate into several electronic modules.

An indentation, or a downset area, can further be made in the metal foil between the cuts above each of the dies in order to improve the heat dissipation. When using such an indentation a heat path away from the die is provided, and heat dissipated by the circuits may more easily reach the shielding and be dissipated to the environment. In an alternate embodiment the plating is made thicker, whereby an indentation can be accomplished in a similar manner.

The use of a metal foil should advantageously be combined with a step of filling the cut with a conductive filler in order to improve the electrical contact and thermal path between the conductive coating 7 and the conductive layer 4 within the laminate, as described earlier.

In accordance with an embodiment an electronic module can be produced from a laminate 1 comprising a conductive layer 4 within the laminate. One or more dies 2 and/or surface mounted devices are arranged on an upper surface of the laminate 1, and embedded by a moulding compound 3. A conductive coating 7 is applied in accordance with the method described above, covering the moulding compound, the upper surface of the laminate 1, and at least one side surface of the laminate 1. Thereby an electric contact is established between the conductive coating 7 and the conductive layer 4 within the laminate.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for manufacturing electronic modules from a moulded module strip comprising a laminate, and one or more dies and/or surface mounted devices arranged on an upper surface of said laminate embedded by a moulding compound, said laminate comprising a conductive layer within the laminate, the method comprising the steps of:

(a) cutting partway through the moulded module strip, reaching at least through said moulding compound and through said conductive layer in said laminate, thereby creating a first cut of a width in said moulded module strip, (b) covering an upper surface of said moulded module strip by a conductive coating, (c) filling the cut with a conductive filler for covering at least one of the surfaces of said first cut, by said conductive filler, thereby establishing electrical contact between the conductive coating on the upper surface of said moulded module strip and said conductive layer in said laminate, and (d) singulating said moulded module strip into separate electronic modules by cutting all the way through said laminate by creating a second cut in said first cut, said second cut having a width smaller than the width of said first cut, wherein said step (b) of covering the upper surface of said moulded module strip by said conductive coating is performed after said step (a) of cutting partway through said moulded module strip, then followed by steps (c) and (d).

2. The method as claimed in claim 1, wherein steps (a) and (d) are repeated in one or more directions.

3. The method as claimed in claim 1, wherein said step (b) of covering the upper surface of said moulded module strip by said conductive coating and/or said step (c) of covering at least one surface of the first cut by said conductive filler is accomplished by means of sputtering, evaporation, spraying, electroplating, electroless plating or any combination thereof.

4. The method as claimed in claim 1, wherein said cutting in steps (a) and (d) is accomplished by means of sawing or milling.

5. The method as claimed in claim 1, wherein said conductive coating is a metal foil, such as a copper foil, which is glued to the upper surface of the laminate.

6. The method as claimed in claim 1, wherein said laminate is a printed circuit board or a low-temperature co-fired ceramic.

7. The method as claimed in claim 1, wherein said conductive coating is of copper.

* * * * *